United States Patent
Arai et al.

(10) Patent No.: US 6,917,557 B2
(45) Date of Patent: Jul. 12, 2005

(54) SEMICONDUCTOR INTEGRATED CIRCUIT HAVING UNIT CELLS

(75) Inventors: Kenji Arai, Tokyo (JP); Hidekatsu Kikuchi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 105 days.

(21) Appl. No.: 10/669,257

(22) Filed: Sep. 25, 2003

(65) Prior Publication Data

US 2004/0109375 A1 Jun. 10, 2004

(30) Foreign Application Priority Data

Dec. 5, 2002 (JP) ........................................ 2002-353181

(51) Int. Cl.$^7$ ................................................ G11C 7/00
(52) U.S. Cl. .................. 365/227; 365/233; 365/230.06; 365/63
(58) Field of Search ................................ 365/227, 233, 365/230.06, 63

(56) References Cited

U.S. PATENT DOCUMENTS

| | | | | |
|---|---|---|---|---|
| 5,757,645 A | * | 5/1998 | Schneider et al. | ............ 701/29 |
| 6,229,753 B1 | * | 5/2001 | Kono et al. | .................... 365/63 |
| 6,567,328 B1 | * | 5/2003 | Higuchi | ..................... 365/226 |

FOREIGN PATENT DOCUMENTS

| | | |
|---|---|---|
| JP | 57-121250 | 7/1982 |
| JP | 62-150844 | 7/1987 |
| JP | 07-056984 | 3/1995 |
| JP | 07-240468 | 9/1995 |
| JP | 2001-007293 | 1/2001 |

* cited by examiner

*Primary Examiner*—Richard Elms
*Assistant Examiner*—Tuan T. Nguyen
(74) *Attorney, Agent, or Firm*—Volentine Francos & Whitt, PLLC

(57) ABSTRACT

A semiconductor integrated circuit includes a unit cell array, a power trunk line, first power branch lines and second power branch lines. The unit cell array includes logic unit cells for providing general circuits and clock unit cells for providing clock drivers. The power trunk line is formed on a peripheral area of the unit cell array. The power trunk line supplies a power source potential. The first power branch lines are formed on the unit cell array for supplying the power source potential to the logic unit cells. The first power branch lines are connected each other and connected to the power trunk line. The second power branch lines are formed on the unit cell array for supplying the power source potential to the clock unit cells. The second power branch lines are connected each other and connected to the power trunk line.

21 Claims, 5 Drawing Sheets

SEMICONDUCTOR INTEGRATED CIRCUIT HAVING UNIT CELLS

BACKGROUND OF THE INVENTION

The present invention relates to a semiconductor integrated circuit such as a gate array or the like.

In a semiconductor integrated circuit, a clock has heretofore been used in general for synchronization of an internal operation. The clock is supplied to respective logic circuits or the like in the integrated circuit through clock drivers and clock conductive lines.

The respective clock drivers and respective circuit blocks are respectively supplied with a source potential and a ground potential by power and ground lines. In the present application, the power and ground lines are collectively called "power conductive line".

As technologies related to the clock drivers and power conductive line, for example, the following Patent Documents have been known.

In a semiconductor integrated circuit disclosed in Japanese Patent Application Laid-Open No. Hei 7(1995)-240468, a power conductive line is formed in a lattice form and clock drivers are placed in the vicinity of the center thereof (see FIG. 1 of the same document). Here the power conductive line includes power branch lines disposed so as to intersect in all directions, and a power trunk line disposed along the outer periphery of the integrated circuit.

Even in a semiconductor integrated circuit disclosed in Japanese Patent Application Laid-Open No. 2001-7293, a power conductive line is formed in a lattice form in a manner similar to the above publication. Even in this example, the power conductive line has power branch lines placed so as to intersect in every direction, and a power trunk line disposed along the outer periphery of the integrated circuit. Clock drivers are disposed directly below the power trunk line.

In the semiconductor integrated circuit disclosed in each of the above publications, the clock drivers and circuit blocks make use of the same power conductive line. A region for forming each clock driver and a region for forming each logic circuit or the like are close to each other although not identical. Therefore, the conventional semiconductor integrated circuit is accompanied by a drawback that when noise is produced by the clock drivers, it is propagated to the logic circuits or the like through the power conductive line. This noise will lead to a malfunction of each logic circuit or the like.

While there is now an increasingly demand for speeding up of the operation of a semiconductor integrated circuit, there is a need to increase the frequency of a synchronizing clock for the purpose of enhancing the operating speed of the semiconductor integrated circuit. However, as the frequency of the clock increases, noise is apt to occur within each clock driver. Therefore, the noise propagated from the clock drivers to the logic circuits or the like has conventionally resulted in one cause of interference with the speeding up of the semiconductor integrated circuit.

Besides, the conventional semiconductor integrated circuit is also accompanied by a drawback that when the clock frequency is made high to increase the operating speed, power consumption of each clock driver increases.

SUMMARY OF THE INVENTION

A semiconductor integrated circuit has been expected wherein noise produced in clock drivers is hard to be propagated to logic circuits or the like and low in power consumption.

A semiconductor integrated circuit according to the present invention includes a unit cell array, a power trunk line, first power branch lines and second power branch lines. The unit cell array includes logic unit cells for providing general circuits and clock unit cells for providing clock drivers. The power trunk line is formed on a peripheral area of the unit cell array. The power trunk line supplies a power source potential. The first power branch lines are formed on the unit cell array for supplying the power source potential to the logic unit cells. The first power branch lines are connected each other and connected to the power trunk line. The second power branch lines are formed on the unit cell array for supplying the power source potential to the clock unit cells. The second power branch lines are connected each other and connected to the power trunk line.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
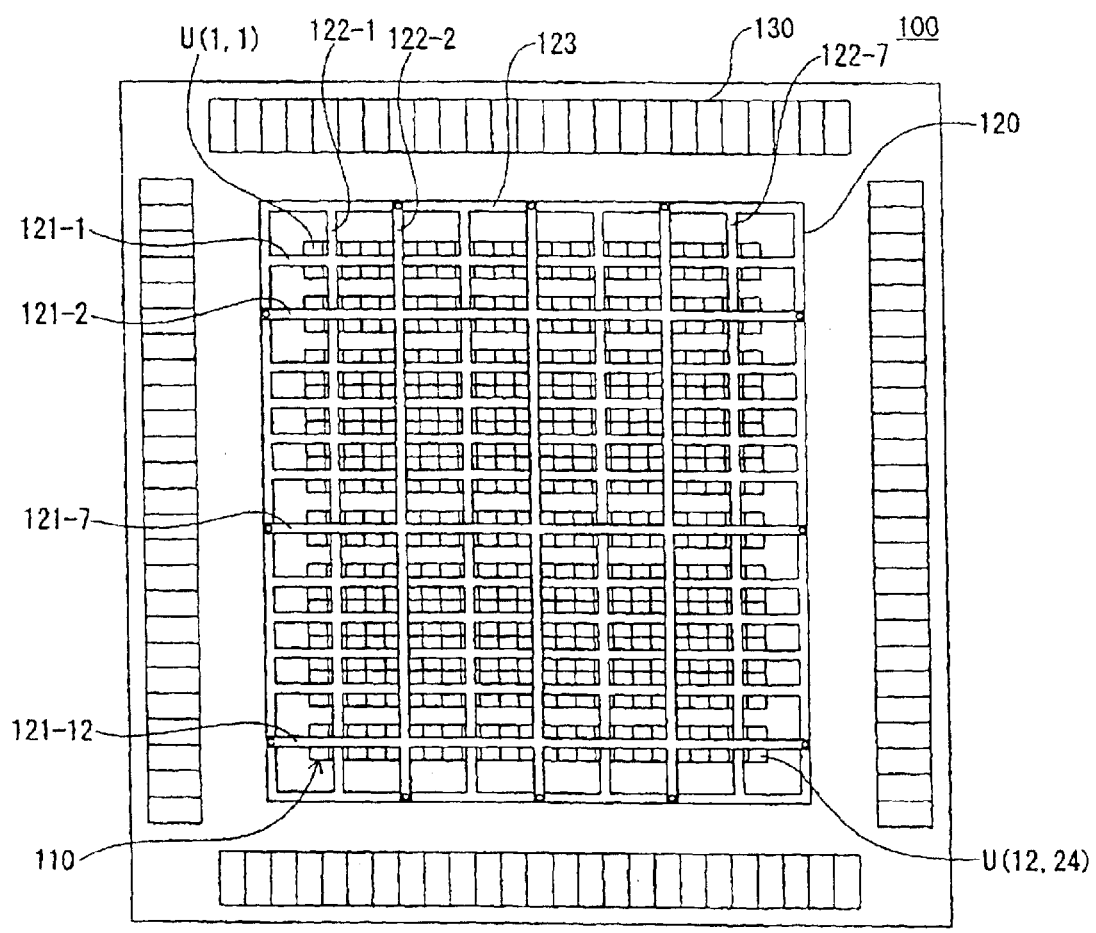
FIG. 1 is a plan view conceptually showing a layout configuration of a semiconductor integrated circuit according to a first embodiment.

Preferred embodiments of the present invention will hereinafter be described with reference to the accompanying drawings. Incidentally, the size, shape and layout relationship of each individual component in the drawings are simply schematically shown to such an extent as to make the present invention understandable. Numerical conditions to be described later are merely illustrated.

A first embodiment of the present invention will hereinafter be described using FIGS. 1 and 2 with the application of the present invention to a gate array as an example.

FIG. 1 is a plan view conceptually showing a layout configuration of a gate array according to the present embodiment. FIG. 2 is a partly enlarged view of FIG. 1.

As shown in FIG. 1, the gate array 100 according to the present embodiment comprises a unit cell block 110, a power conductive line 120, I/O circuits 130, . . . , The unit cell block 110 includes 12×24 unit cells U(1, 1) through U(12, 24) disposed in matrix form.

Of these unit cells U(1, 1) through U(12, 24), the unit cells corresponding to a first row, third to sixth rows and eighth to eleventh rows are all logic unit cells, whereas other unit cells are clock unit cells. Now, the logic unit cells are unit cells for forming ordinary logic circuits or the like. Further, the clock unit cells are unit cells for forming clock drivers.

Figure 2:
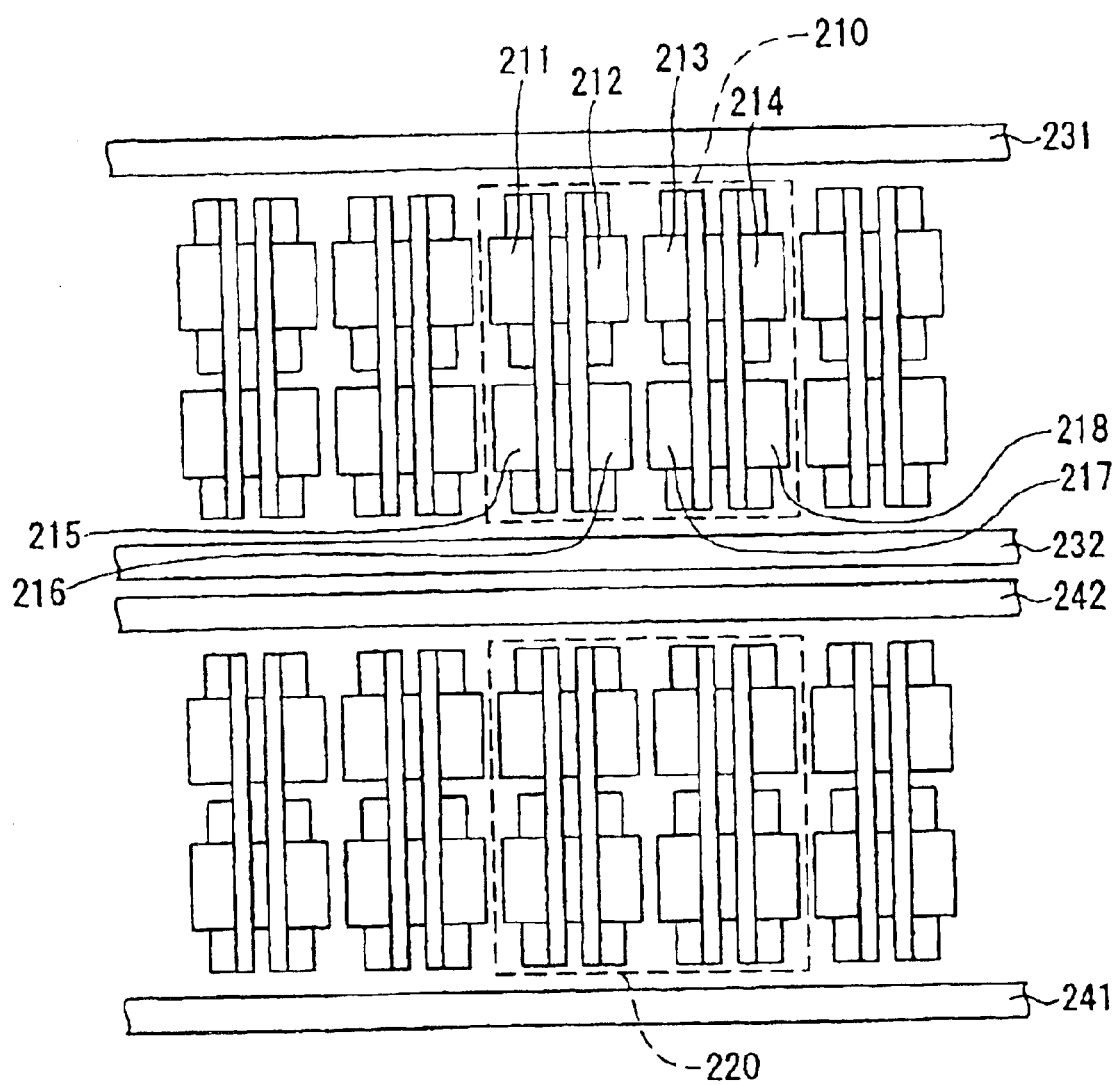
FIG. 2 is a partly enlarged view of FIG. 1.

As shown in FIG. 2, each individual logic unit cell 210 has four pMOS transistors 211 through 214, and four nMOS transistors 215 through 218. Suitably conductive line these MOS transistors 211 through 214 and 215 through 218 makes it possible to obtain a desired logic circuit or the like. An internal structure of a clock unit cell 220 is also similar to the logic unit cell. As described above, the MOS transistors lying within the logic unit cell 210 are used to configure an ordinary logic circuit or the like. The MOS transistors lying within the clock unit cell 220 are used to configure each clock driver.

The respective MOS transistors of the logic unit cell 210 and the clock unit cell 220 may be perfectly identical to one another in design or different in size from one another.

The power conductive line 120 (see FIG. 1) includes power branch lines 121-1 through 121-12 extending in a row direction, power branch lines 122-1 through 122-7 extending in a column direction, and a power trunk line 123.

Of the power branch lines 121-1 through 121-12 extending in the row direction, the power branch lines 121-1, 121-3 through 121-6 and 121-8 through 121-11 are respectively power branch lines for supplying a source potential and a ground potential to their corresponding logic unit cells (i.e., unit cells corresponding to the first row, third to sixth rows and eighth to eleventh rows). The other power branch lines 121-2, 121-7 and 121-12 extending in the row direction are respectively power branch lines for supplying the source potential and the ground potential to their corresponding clock unit cells (i.e., unit cells corresponding to the second, seventh and twelfth rows). As shown in FIG. 2, the power branch lines respectively include power lines 231 and 241 and ground lines 232 and 242.

Of the power branch lines 122-1 through 122-7 extending in the column direction, the power branch lines 122-1, 122-3, 122-5 and 122-7 are respectively power branch lines for supplying the source potential and ground potential to their corresponding logic unit cells. The other power branch lines 122-2, 122-4 and 122-6 extending in the column direction are respectively power branch lines for supplying the source potential and the ground potential to their corresponding clock unit cells. In a manner similar to the power branch lines 121-1 through 121-12 extending in the row direction, the power branch lines 122-1 through 122-7 extending in the column direction also respectively include power lines and ground lines (see FIG. 2). Here, the power branch lines 122-1, 122-3, 122-5 and 122-7 for the logic unit cells are respectively connected to the above power branch lines 121-1, 121-3 through 121-6, and 121-8 through 121-11 by their corresponding power lines and their corresponding ground lines. Similarly, the power branch lines 122-2, 122-4 and 122-6 for the clock unit cells are respectively connected to the above power branch lines 121-2, 121-7 and 121-12 by their corresponding power lines and their corresponding ground lines.

The power trunk line 123 is a ring-shaped power conductive line formed along the outer periphery of the unit cell block 110. In a manner similar to the power branch lines 121-1 through 121-12, and 122-1 through 122-7, the power trunk line 123 also include the power lines and ground lines (see FIG. 2). The source potential and the ground potential are supplied to the power lines and ground lines lying within the power trunk line 123 through unillustrated pads. Ends of the power lines of the respective power branch lines 121-1 through 121-12, and 122-1 through 122-7 are respectively connected to the power lines in the power trunk line 123, and ends of the ground lines thereof are respectively connected to the ground lines in the power trunk line 123. Thus, the source potential and ground potential inputted to the power trunk line 123 are supplied to their corresponding power branch lines 121-1 through 121-12, and 122-1 through 122-7.

The I/O circuits 130 are respectively provided along the outer periphery of the semiconductor integrated circuit 100. These I/O circuits 130, . . . perform the input/output of signals and clocks from and to external circuits. The I/O circuits 130 are connected to signal lines (not shown) of their corresponding unit cells. Since each I/O circuit 130 is similar in internal structure to the known gate array, the description thereof will be omitted.

In the gate array 100 according to the present embodiment as shown in FIG. 1, the power branch lines 121-1, through 121-12, and 122-1 through 122-7 are divided into those for the logic unit cells and those for the clock unit cells. Therefore, the influence of noise can be suppressed due to the following reasons.

Each of the clock drivers lying within the clock unit cells might produce noise. The noise is outputted to the power branch lines (power lines and ground lines) connected to the clock unit cells. As described above, there is a possibility that when the noise reaches each logic unit cell through the power conductive line 120, a circuit lying within the logic unit cell will malfunction.

In the present embodiment as described above, the power branch lines for the clock unit cells and the power branch lines for the logic unit cells are not directly connected but connected through the power trunk line 123. Thus, the noise outputted to the power branch lines for the clock unit cells reaches the power branch lines for the logic unit cells through the power trunk line 123 and is thereafter inputted to the logic unit cells. Therefore, a propagation path of the noise on the power conductive line till the input of the noise outputted from each clock unit cell to each clock unit cell becomes longer than the conventional one (refer to the Patent Documents). Here, the magnitude of the noise propagated over the power conductive line is reduced by the resistance and capacitance of the power conductive line. In the gate array 100 according to the present embodiment, the conductive line resistance and capacitance are also increased by the noise propagation path which becomes longer than that of the conventional integrated circuit. Thus, according to the present embodiment, the noise inputted to each logic unit cell can be reduced as compared with the conventional integrated circuit.

In addition, the gate array 100 according to the present embodiment needs to definitely allow the noise propagated over the power branch lines for the clock unit cells to pass through the power trunk line 123 in order to cause the noise to reach the power branch lines for the logic unit cells. As described above, the power potential and the ground potential are directly applied to the power trunk line 123 through power pads. Thus, the power trunk line 123 is hard to change in potential as compared with the power branch lines. Therefore, the noise is suppressed when it passes through the power trunk line 123.

According to the gate array 100 according to the present embodiment as described above, the distance of the power conductive line over which the noise propagates, is set so as to be long, and the noise is caused to assuredly pass through the power trunk line. It is therefore possible to reduce the noise propagated from the clock unit cells to the logic unit cells through the power conductive line 120. Thus, since the circuit lying in each logic unit cell becomes hard to malfunction, the operating speed of the gate array can be made fast with ease.

A second embodiment of the present invention will next be described using FIGS. 3 through 6 with the application of the present invention to a gate array as an example.

Figure 3:
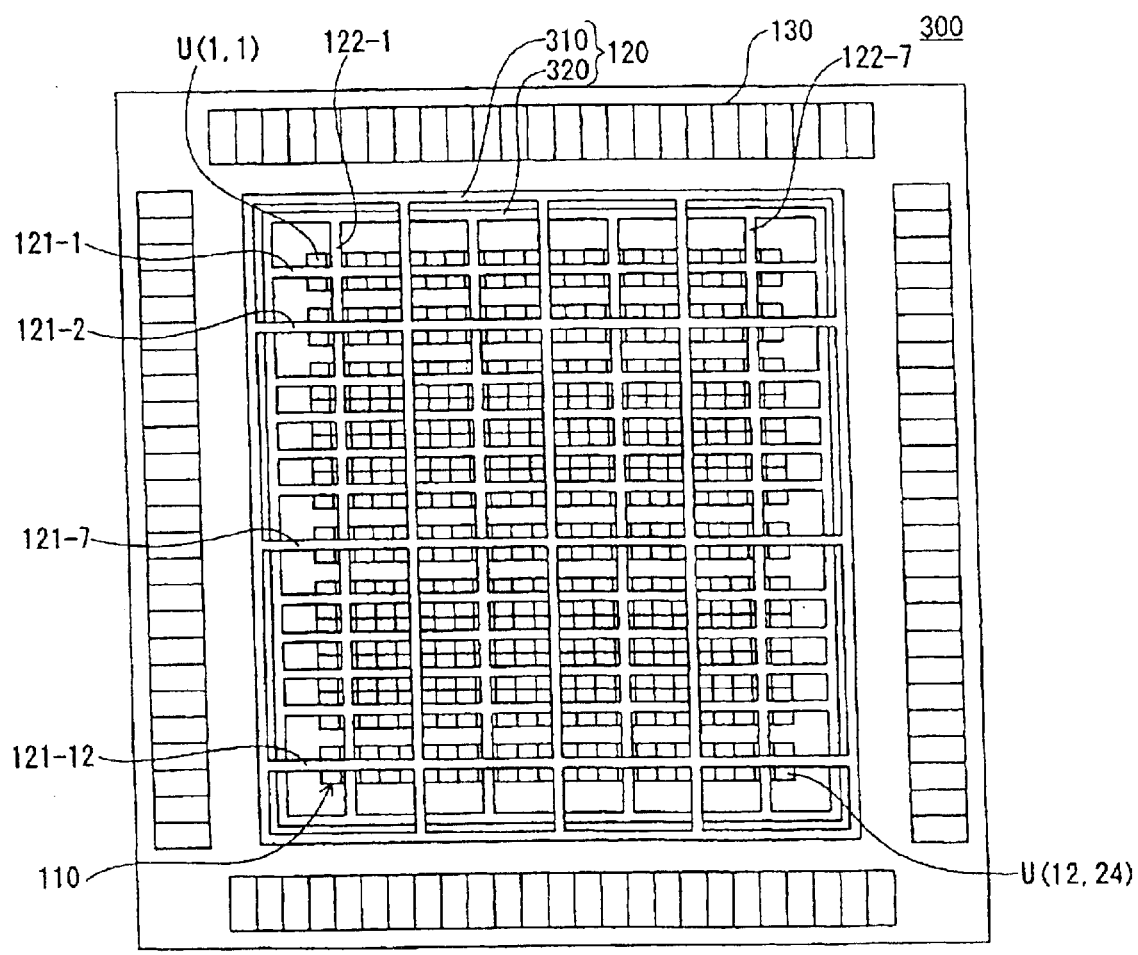
FIG. 3 is a plan view conceptually illustrating a layout configuration of a semiconductor integrated circuit according to a second embodiment.

FIG. 3 is a plan view conceptually showing a layout configuration of a gate array according to the present embodiment. In FIG. 3, elements of structure to which the same reference numerals as those shown in FIG. 1 are respectively assigned, respectively indicate the same ones as those shown in FIG. 1.

As is understood from FIG. 3, the gate array 300 according to the present embodiment includes power trunk lines 310 and 320 of two systems.

The power trunk line 310 supplies a source potential and a ground potential to power branch lines 121-1, 121-3 through 121-6, 121-8 through 121-11, 122-1, 122-3, 122-5 and 122-7 for logic unit cells. The power trunk line 310 is a ring-shaped power conductive line and is formed along the outer periphery of a unit cell block 110. In a manner similar to the power trunk line 123 employed in the first embodiment, the power trunk line 310 includes power lines and ground lines. The power lines of the power trunk line 310 are respectively connected to power lines of the power branch lines for the logic unit cells, whereas the ground lines of the power trunk line 310 are respectively connected to ground lines of the power branch lines for the logic unit cells. The source potential and the ground potential are respectively supplied to the power lines and the ground lines lying within the power trunk line 310 through unillustrated pads.

On the other hand, the power trunk line 320 supplies the source potential and the ground potential to power branch lines 121-2, 121-7, 121-12, 122-1, 122-2, 122-4 and 122-6 for clock unit cells. The power trunk line 320 is a ring-shaped power conductive line and is formed along the outer periphery of the power trunk line 310. In a manner similar to the power trunk line 310 and the power trunk line 123 employed in the first embodiment, the power trunk line 320 includes power lines and ground lines. The power lines of the power trunk line 320 are respectively connected to power lines of power branch lines for clock unit cells, whereas the ground lines of the power trunk line 320 are respectively connected to ground lines of the power branch lines for the clock unit cells. The source potential and the ground potential are respectively supplied to the power lines and ground lines lying within the power trunk line 320 through unillustrated pads.

Thus, in the gate array 300 according to the present embodiment, the power conductive line for the logic unit cells and the power conductive line for the clock unit cells are perfectly separated from each other. The power trunk lines 310 and 320 are individually supplied with the source potential and the ground potential through the unillustrated pads. Accordingly, there is no possibility of noise produced in each clock cell unit being propagated to its corresponding logic unit cell.

In the present embodiment, the source potential supplied to each power line of the power trunk line 320 is set to a value lower than the source potential supplied to each power line of the power trunk line 310. Since a leakage current and charge/discharge currents flowing in each clock unit cell can be reduced owing to a reduction in the source voltage of the power trunk line 320, the gate array 300 can be reduced in power consumption.

When the source voltage of the power trunk line 320 is set low, there is a need to provide a level shifter for converting a high level potential of a clock supplied from the clock unit cell to the logic unit cell. FIG. 4 is a diagram for describing a clock, wherein FIG. 4(A) is a circuit block diagram and FIG. 4(B) is a signal waveform diagram, respectively.

Figure 4A:
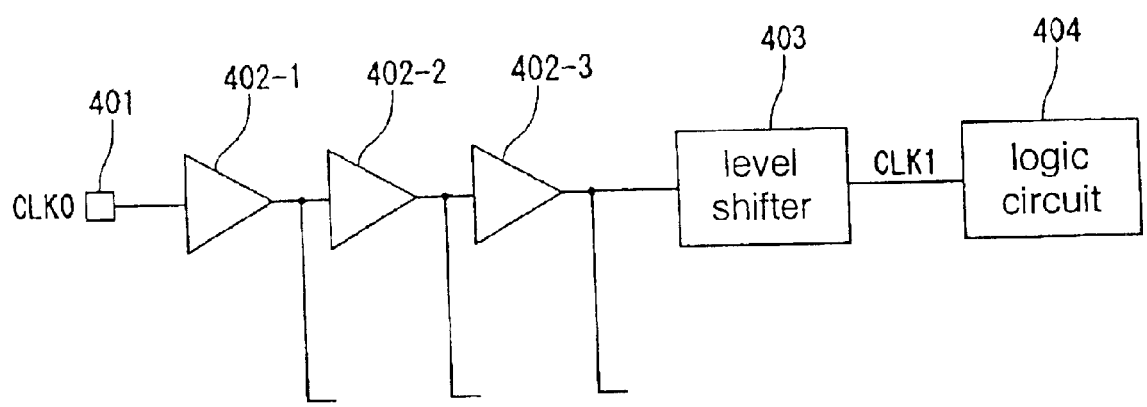
FIG. 4(A) is a circuit diagram for describing a clock used in the second embodiment.
Figure 4B:
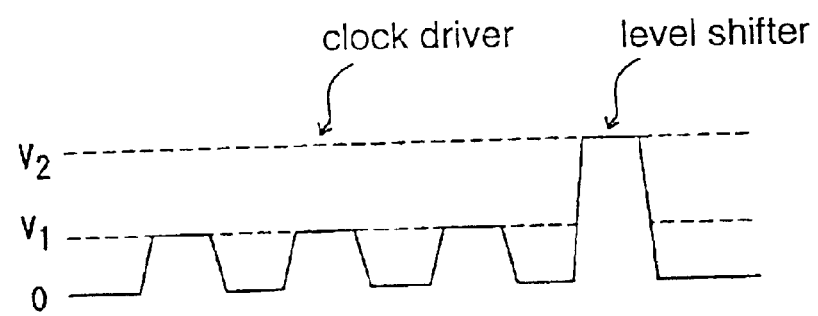
FIG. 4(B) is a signal waveform diagram for describing a clock used in the second embodiment.

As shown in FIG. 4(A), a clock CLK0 is inputted from a pad 401 and inputted to a level shifter 403 through a plurality of clock drivers 402-1 through 402-3 (three in the example of FIG. 4). The level shifter 403 converts the clock CLK0 to a clock CLK1 and supplies it to a logic circuit 404.

Here, the clock drivers 402-1 through 402-3 are formed in their corresponding clock unit cells. Therefore, when the source potential for each clock unit cell is set to V1, a high level potential of the clock CLK0 outputted from each of the clock drivers 402-1 through 402-3 results in V1 (see FIG. 4(B)). On the other hand, the logic circuit 404 is formed in each logic unit cell. Thus, when the source potential for the logic circuit 404 is set to V2 (V2>V1), a high level potential of a clock CLK1 inputted to the logic circuit must be V2. Therefore, the level shifter 403 is used to convert the high level potential of the clock from V1 to V2 (see FIG. 4(B)) in the present embodiment.

Figure 5:
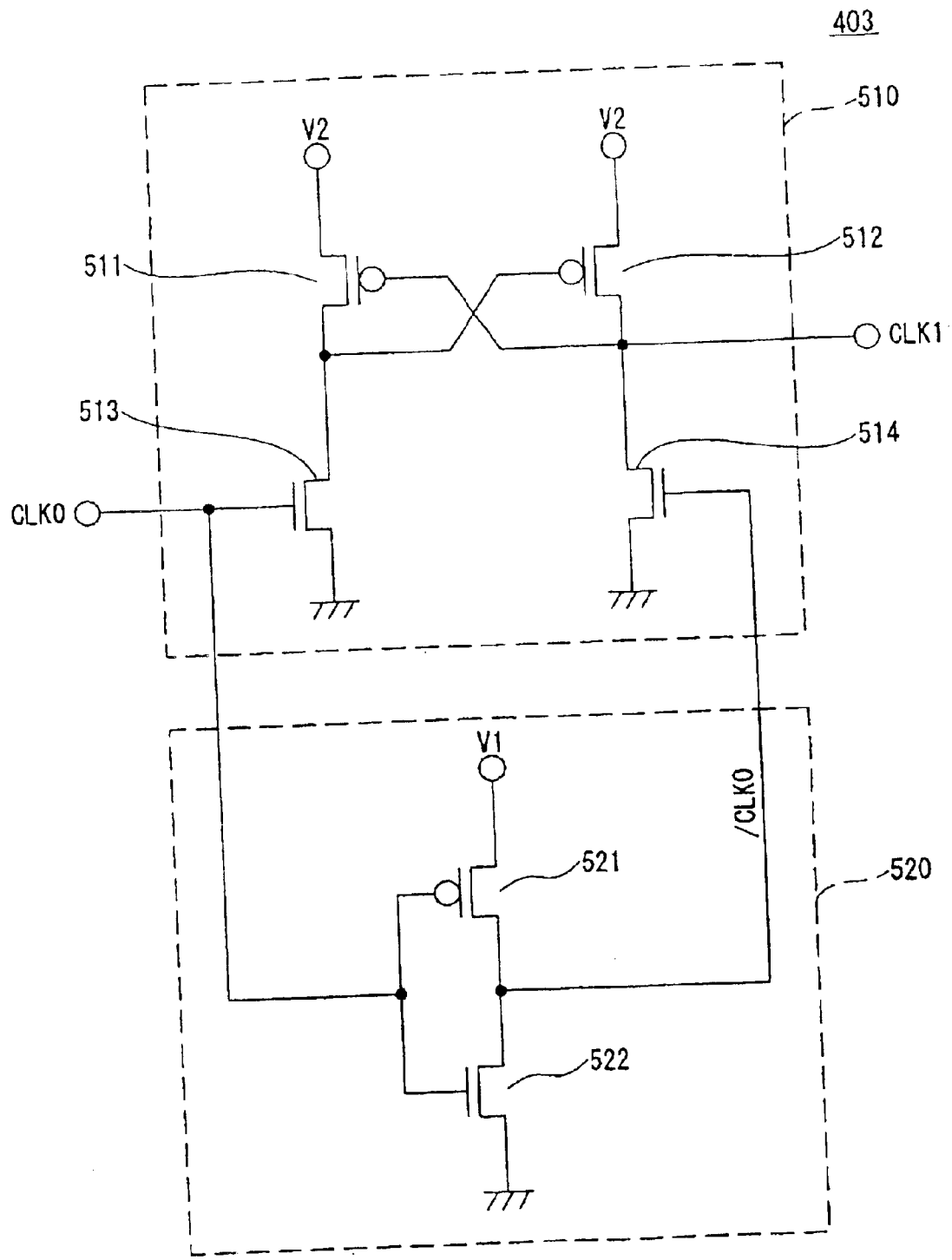
FIG. 5 is a circuit diagram showing an example of a configuration of a level shifter.

FIG. 5 is a circuit diagram showing one configurational example of the level shifter 403.

As shown in FIG. 5, the level shifter 403 comprises a potential converting circuit 510 comprising MOS transistors 511 through 514 lying within each logic unit cell, and an inversion gate 520 comprising MOS transistors 521 and 522 lying within each clock unit cell.

In the potential converting circuit, the pMOS transistors 511 and 512 are connected to power lines of power branch lines for logic unit cells at their sources. Accordingly, a source potential V2 is applied to the sources of the pMOS transistors 511 and 512. The drain of the pMOS transistor 512 is connected to the gate of the pMOS transistor 511. Similarly, the drain of the pMOS transistor 511 is connected to the gate of the pMOS transistor 512. The drain of the nMOS transistor 513 is connected to the drain of the pMOS transistor 511. The source of the nMOS transistor 513 is connected to its corresponding ground line of the power branch lines for the logic unit cells. Similarly, the drain of the nMOS transistor 514 is connected to the drain of the pMOS transistor 512. The source of the nMOS transistor 514 is connected to its corresponding ground line of the power branch lines for the logic unit cells. A clock CLK0 is inputted to the gate of the nMOS transistor 513. On the other hand, an inverted value/CLK0 of the clock CLK0 is inputted to the gate of the nMOS transistor 514.

In the inversion gate 520, the source of the pMOS transistor 521 is connected to its corresponding power line of power branch lines for the clock unit cells, so that the source potential V1 is applied. Further, the drain of the nMOS transistor 522 is connected to the drain of the pMOS transistor 521, and the source thereof is connected to its corresponding ground line of the power branch lines for the clock unit cells. The gates of these transistors 521 and 522 are inputted with the clock CLK0. Thus, the inversion gate 520 outputs the inverted value/CLK0 of the clock CLK0.

When the clock CLK0 is a low level (ground potential) in the level shifter 403 configured in this way, the nMOS transistor 513 is turned off and the nMOS transistor 514 is turned on. With the turning on of the nMOS transistor 514, the potential at the gate of the pMOS transistor 511 becomes low in level, so that the pMOS transistor 511 is turned on. Since the nMOS transistor 513 is held off at this time, the potential at the gate of the pMOS transistor 512 is brought to a high level, so that the pMOS transistor 512 is turned off.

Thus, the potential of the clock CLK1 is brought to the low level (ground potential).

On the other hand, when the clock CLK0 is of a high level (V1), the nMOS transistor 513 is turned on and the nMOS transistor 514 is turned off. With the turning on of the nMOS transistor 513, the potential at the gate of the pMOS transistor 512 becomes low in level, so that the pMOS transistor 512 is turned on. Since the nMOS transistor 514 is held off at this time, the potential of the clock CLK1 becomes high in level (V2).

In order to convert the high level potential from V1 to V2 in this way, there is a need to apply the source potential V2 to the sources of the pMOS transistors 511 and 512 and apply the source potential V1 to the source of the pMOS transistor 521.

The transistors, which are different in source potential, need to be formed in wells different from each other. Thus, when such a level shifter 403 as shown in FIG. 5 is formed on the conventional semiconductor integrated circuit (refer to the above-described Patent Documents), two types of wells are formed in level shifter forming regions of a semiconductor substrate. In this case, there is a need to provide the pMOS transistors 511 and 512 in one well and provide the pMOS transistor 521 in the other well. Therefore, when the level shifter is formed by the normal technology, the level shifter forming region increases in area, thus resulting in a reduction in integration rate. Further, the number of level shifters and the forming positions thereof are fixed, thereby causing a reduction in the degree of freedom of their design. Since the gate array is of an integrated circuit with the objective of allowing pre-arranged transistor sequences to be freely wired and shortening TAT (Turn Around Time) in particular, the fixing of both the forming positions of the level shifters and the number thereof to be formed result in a large drawback.

In the present embodiment in contrast, the unit cell block 110 is formed with being divided into the rows comprising the logic unit cells and the rows comprising the clock unit cells. Accordingly, the logic unit cell and the clock unit cell adjacent to each other are used one by one so that the level shifter 403 can be formed. According to the present embodiment, the forming positions of the level shifters 403 and the number thereof to be formed are therefore not limited, and no TAT is degraded.

According to the gate array 300 according to the present embodiment as described above, the power trunk lines 310 and 320 are provided to perfectly separate the power conductive line for the logic unit cells and the power conductive line for the clock unit cells. Therefore, the noise produced in the clock unit cells is not propagated to the logic unit cells. Thus, since the circuit lying in each logic unit cell becomes hard to malfunction, the operating speed of the gate array is easily made fast.

Owing to the perfect separation between the power conductive line for the logic unit cells and the power conductive line for the clock unit cells in addition to the above, the source potential for each clock unit can be set lower than that for each logic unit. Accordingly, the gate array 300 can be reduced in power consumption.

Further, since the level shifters are formed using the logic unit cells and the clock unit cells one by one, the degree of freedom of the design of the gate array 300 and TAT are not impaired.

Incidentally, while the source potential for each clock unit is set lower than that for each logic unit in the present embodiment, they may be set to the same potential. Since noise produced in each clock unit cell is not propagated to each logic unit cell even in this case, the operating speed of the gate array can be easily made fast. In this case, however, there is no need to form the level shifter 403 for the clock.

While the aforementioned first and second embodiments respectively have described the examples in which the power branch lines extending in the row and column directions are provided, the present invention can be applied even to a gate array having only power branch lines extending in a row direction.

According to the present invention as described above in detail, a semiconductor integrated circuit in which noise produced within a clock driver is hard to propagate to a circuit block, and a semiconductor integrated circuit capable of high-speed operation can be obtained.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:
    a unit cell array including a plurality of logic unit cells for providing general circuits and a plurality of clock unit cells for providing clock drivers;
    a power trunk line formed on a peripheral area of the unit cell array, the power trunk line supplying a power source potential;
    a plurality of first power branch lines formed on the unit cell array for supplying the power source potential to the logic unit cells, the first power branch lines connected each other and connected to the power trunk line; and
    a plurality of second power branch lines formed on the unit cell array for supplying the power source potential to the clock unit cells, the second power branch lines connected each other and connected to the power trunk line.

2. A semiconductor integrated circuit according to claim 1, wherein the first power branch lines includes a first column power branch line and a first row power branch line connected to the first column power blanch line at an intersection thereof.

3. A semiconductor integrated circuit according to claim 1, wherein the second power branch lines includes a second column power branch line and a second row power blanch line connected to the second column power branch line at an intersection thereof.

4. A semiconductor integrated circuit according to claim 1, wherein each of the logic unit cells has a plurality of transistors.

5. A semiconductor integrated circuit according to claim 4, wherein the transistors include a plurality of PMOS transistors and a plurality of NMOS transistors.

6. A semiconductor integrated circuit according to claim 1, wherein each of the clock unit cells has a plurality of transistors.

7. A semiconductor integrated circuit according to claim 6, wherein the transistors include a plurality of PMOS transistors and a plurality of NMOS transistors.

8. A semiconductor integrated circuit according to claim 1, further comprising an I/O circuit formed on an outer peripheral area of the power trunk line.

9. A semiconductor integrated circuit comprising:
a unit cell array including a plurality of logic unit cells for providing general circuits and a plurality of clock unit cells for providing clock drivers;
a first power trunk line formed on a peripheral area of the unit cell array, the first power trunk line supplying a power source potential;
a second power trunk line formed on the peripheral area, the second power trunk line supplying the power source potential, the first and second power trunk line being disconnected in the peripheral area;
a plurality of first power branch lines formed on the unit cell array for supplying the power source potential to the logic unit cells, the first power branch lines connected each other and connected to the first power trunk line; and
a plurality of second power branch lines formed on the unit cell array for supplying the power source potential to the clock unit cells, the second power branch lines connected each other and connected to the second power trunk line.

10. A semiconductor integrated circuit according to claim 9, wherein the first power branch lines includes a first column power branch line and a first row power branch line connected to the first column power blanch line at an intersection thereof.

11. A semiconductor integrated circuit according to claim 9, wherein the second power branch lines includes a second column power branch line and a second row power branch line connected to the second column power branch line at an intersection thereof.

12. A semiconductor integrated circuit according to claim 9, wherein each of the logic unit cells has a plurality of transistors.

13. A semiconductor integrated circuit according to claim 12, wherein the transistors include a plurality of PMOS transistors and a plurality of NMOS transistors.

14. A semiconductor integrated circuit according to claim 9, wherein each of the clock unit cells has a plurality of transistors.

15. A semiconductor integrated circuit according to claim 14, wherein the transistors include a plurality of PMOS transistors and a plurality of NMOS transistors.

16. A semiconductor integrated circuit according to claim 9, further comprising an I/O circuit formed on an outer peripheral area of the power trunk line.

17. A semiconductor integrated circuit comprising:
a unit cell block having a plurality of unit cells disposed in matrix form, the unit cell block having a plurality of logic unit cells for providing general circuit and a plurality of clock unit cells for providing clock drivers;
a first power branch line provided along a row direction of the matrix, the first power branch line supplying a source potential and a ground potential to the logic unit cells;
a second power branch line provided along the row direction, the second power branch line supplying the source potential and the ground potential to the clock unit cells; and
a power trunk line connected to ends of the first power branch line and the second power branch line.

18. A semiconductor integrated circuit according to claim 17, further including,
a third power branch line for supplying the source potential and the ground potential to the logic unit cells, the third power branch line being provided along a column direction of the matrix and having an end connected to the power trunk line, and
a fourth power branch line for supplying the source potential and the ground potential to the clock unit cells, said fourth power branch line being provided along the column direction and having an end connected to the power trunk line.

19. A semiconductor integrated circuit according to claim 17, wherein the power trunk line includes,
a first power trunk line connected to the end of either one of the first power branch line and the third power branch line, and
a second power trunk line connected to the end of either one of the second power branch line and the fourth power branch line.

20. A semiconductor integrated circuit according to claim 19, wherein the source potential supplied by the second power trunk line is lower than the source potential supplied by the first power trunk line.

21. A semiconductor integrated circuit according to claim 19, further including a level shift circuit for generating a clock signal supplied to the general circuits.

* * * * *